United States Patent
Perkins et al.

[11] Patent Number: 6,162,008
[45] Date of Patent: Dec. 19, 2000

[54] WAFER ORIENTATION SENSOR

[75] Inventors: John D. Perkins, Barnstead, N.H.; David Mohr, Gloucester, Mass.

[73] Assignee: Varian Semiconductor Equipment Associates, Inc., Gloucester, Mass.

[21] Appl. No.: 09/327,738

[22] Filed: Jun. 8, 1999

[51] Int. Cl.[7] .................................................. B65G 47/24
[52] U.S. Cl. .......................... 414/754; 198/394; 414/816; 414/936; 901/47
[58] Field of Search ............................ 198/394; 414/754, 414/757, 783, 816, 936, 941; 901/47

[56] References Cited

U.S. PATENT DOCUMENTS

| | | | |
|---|---|---|---|
| 4,345,836 | 8/1982 | Phillips | 355/53 |
| 4,836,733 | 6/1989 | Hertel et al. | 414/225 |
| 4,887,904 | 12/1989 | Nakazato et al. | 414/936 X |
| 5,102,280 | 4/1992 | Poduje et al. | 198/394 X |
| 5,125,791 | 6/1992 | Volovich | 198/394 X |
| 5,238,354 | 8/1993 | Volovich | 414/779 |
| 5,365,672 | 11/1994 | Kato | 198/394 X |
| 5,405,230 | 4/1995 | Ono et al. | 901/47 X |
| 5,452,521 | 9/1995 | Niewmierzycki | 33/520 |
| 5,513,948 | 5/1996 | Bacchi et al. | 414/936 X |
| 5,563,798 | 10/1996 | Berken et al. | 901/47 X |
| 5,740,034 | 4/1998 | Saeki | 414/936 X |

FOREIGN PATENT DOCUMENTS

| | | | |
|---|---|---|---|
| 62-243339 | 10/1987 | Japan | 414/936 |
| 1-202835 | 8/1989 | Japan | 414/936 |

OTHER PUBLICATIONS

E. Hecht, "Optics", Addison–Wesley Pub. Co., 1987, pp. 99–108.

Warren J. Smith, "Modern Optical Engineering" McGraw–Hill Book Co., 1966, pp. 77–78.

*Primary Examiner*—Janice L. Krizek
*Attorney, Agent, or Firm*—Wolf, Greenfield & Sacks, P.C.

[57] ABSTRACT

Apparatus for detection of an edge of a generally disk-shaped workpiece, such as a semiconductor wafer, includes a light source positioned to direct a light beam at the surface of the workpiece near the edge thereof such that a first part of the light beam passes the workpiece and a second part of the light beam is intercepted by the workpiece. An angle between the light beam and a normal to the surface is equal to or greater than a critical angle that produces total internal reflection of the light beam in the workpiece. The apparatus further includes a mechanism for rotating the workpiece and a light sensor positioned to sense the first part of the light beam and to generate an edge signal that represents the edge of the workpiece as the workpiece is rotated. The apparatus may be used for sensing orientation and location of semiconductor wafers of different materials, including those which are transparent to the light beam.

20 Claims, 6 Drawing Sheets

FIG. 7

WAFER ORIENTATION SENSOR

FIELD OF THE INVENTION

This invention relates to orientation sensors for disk-shaped workpieces such as semiconductor wafers and, more particularly, to wafer orientation sensors that are capable of sensing the orientation of a variety of different types of wafers, including quartz wafers.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. In one conventional approach, semiconductor wafers are mounted near the periphery of a disk. The disk is rotated about its central axis and is translated with respect to the ion beam to distribute the ion beam over the semiconductor wafers. The ion implanter typically includes an end station having automated wafer handling equipment for introducing wafers into the ion implanter and for removing wafers after implantation.

The wafer handling system typically transfers wafers from a cassette holder to a process station, such as a wafer mounting site on the disk. One requirement is to accurately position the wafer at the process station with its flat or notch having a predetermined orientation. The slots in the cassette holder are somewhat larger than the wafer and thus do not ensure accurate wafer positioning. Furthermore, the wafer flat or notch orientation is not controlled in the cassette holder. However, accurate positioning at the process station is necessary to ensure reliable wafer retention and to avoid wafer damage. In addition, ion implantation systems typically require a particular wafer flat or notch orientation, which is indicative of the crystal orientation of the wafer, to control channeling by implanted ions.

A wafer transfer system incorporating a wafer orienter is disclosed in U.S. Pat. No. 4,836,733, issued Jun. 6, 1989 to Hertel et al. A wafer is placed on an orienter chuck and is rotated. An orientation sensor includes a light source positioned below the edge of the wafer and a solar cell positioned above the edge of the wafer in alignment with the light source. The light beam from the source is directed perpendicular to the wafer surface. The wafer blocks a portion of the light beam from reaching the solar cell. The signal output from the solar cell is indicative of wafer eccentricity and a fiducial, such as a flat or a notch. Based on the signal from the orientation sensor, eccentricity and rotational orientation may be corrected. Wafer aligners are also disclosed in U.S. Pat. Nos. 5,452,521, issued Sep. 26, 1995 to Niewmierzycki; 5,238,354, issued Aug. 24, 1993 to Volovich; and 4,345,836, issued Aug. 24, 1982 to Phillips.

Prior art wafer orientation sensors provide generally satisfactory results with conventional silicon wafers. However, in some instances, the ion implanter is required to operate with wafers of different materials, including but not limited to quartz, sapphire and glass, with either a notch or a flat as the fiducial. For example, quartz wafers may be utilized for testing uniformity and dose in the ion implanter. The conventional optical orientation sensor is unable to sense the edge of a quartz wafer, because the light beam from the light source is not blocked by the transparent quartz wafer, and the wafer is, to a large degree, invisible to the sensor.

Accordingly, there is a need for improved wafer orientation sensors which can sense the edges of wafers of different materials, including transparent materials.

SUMMARY OF THE INVENTION

According to a first aspect of the invention, apparatus is provided for detection of an edge of a generally disk-shaped workpiece. The apparatus comprises a light source positioned direct a light beam at the surface of the workpiece near the edge thereof such that a first part of the light beam passes the workpiece and a second part of the light beam is intercepted by the workpiece. An angle between the light beam and a normal to the surface is equal to or greater than a critical angle that produces total internal reflection of the light beam in the workpiece. The apparatus further comprises a mechanism for rotating the workpiece and a light sensor positioned to sense the first part of the light beam and to generate an edge signal that represents the edge of the workpiece as the workpiece is rotated. The apparatus may be used for sensing orientation and location of semiconductor wafers of different materials, including those which are transparent to the light beam.

The workpiece may be a semiconductor wafer of a material selected from the group including, but not limited to, quartz, silicon, sapphire and glass. The light source and the light sensor may be configured for detecting a fiducial, such as a notch or a flat, on the wafer. The angle between the light beam and the normal to the surface may be equal to or greater than 65 degrees to accommodate wafers of different materials and manufacturing tolerances.

The light sensor may comprise a linear sensor. The long dimension of the linear sensor is preferably oriented radially with respect to the center of rotation. The light source may include optics for directing a collimated light beam at the surface of the workpiece. The optics may generate a rectangular beam that is directed at the surface of the workpiece with the long dimension of the rectangular beam oriented radially with respect to the center of rotation.

According to another aspect of the invention, a method is provided for detecting an edge of a generally disk-shaped workpiece. The method comprises the steps of directing a light beam at the surface of the workpiece near the edge thereof such that a first part of the light beam passes the workpiece and a second part of the light beam is intercepted by the workpiece. An angle between the light beam and a normal to the surface is equal to or greater than a critical angle that produces total internal reflection of the light beam in the workpiece. The method further comprises the steps of rotating the workpiece, sensing the first part of the light beam, and generating an edge signal that represents the edge of the workpiece as the workpiece is rotated.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
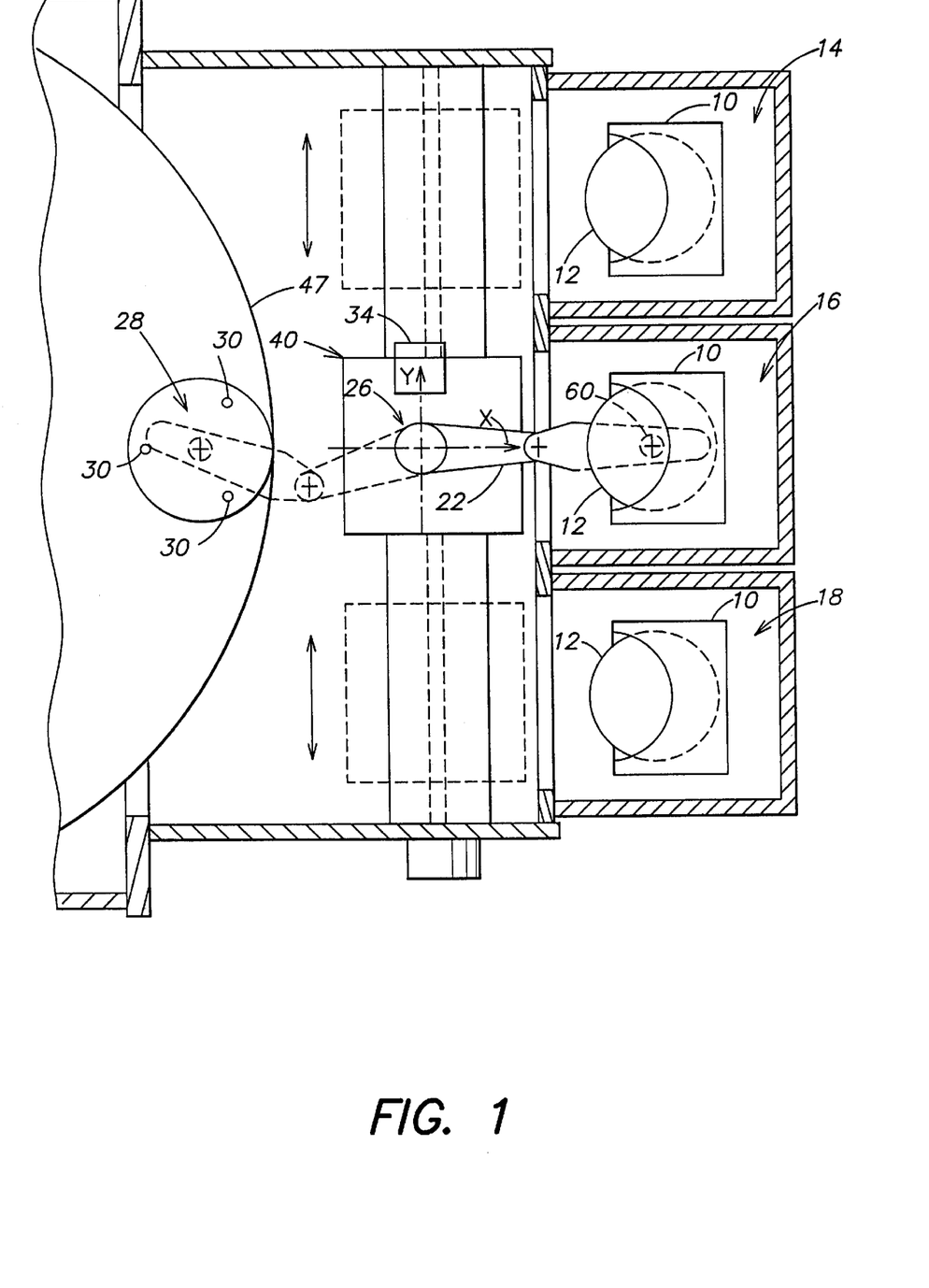
FIG. 1 is a top schematic view of an example of wafer transfer apparatus incorporating a wafer orientation sensor in accordance with the invention.

An example of wafer transfer apparatus suitable for incorporation of the present invention is shown in FIG. 1. The wafer transfer apparatus may be part of an end station for an ion implanter or can be utilized for transferring wafers to a process station in any type of processing or treatment system. Briefly, the apparatus operates as follows. Cassette holders 10, each holding a plurality of wafers 12, are placed in cassette locks 14, 16, 18. The cassette locks 14, 16, 18 are evacuated, and the cassette holders 10 are lowered into an evacuated elevator chamber. Wafers are removed from the cassette holder 10 one at a time by an articulated wafer transfer arm 22 and are moved to a wafer orientation station 26 in a transfer vacuum chamber. The wafer location and orientation are sensed at station 26 by a wafer orientation sensor 34. The angular orientation of the wafer can be changed, if necessary at station 26. The arm 22 is then extended along an X axis, and the wafer is transferred to a process station 28 of a processing system. In placing the wafer at station 28, position errors sensed at station 26 may be eliminated by compensating displacements. At station 28, lift pins 30 are provided for removing the wafer from the transfer arm 22.

After processing, the transfer arm 22 returns the wafer to the cassette holder 10 without use of orientation station 26. When wafers are transferred from either of the outer cassette locks 14, 18, the transfer arm 22 is translated laterally along a Y axis by a drive assembly 40 for access to the respective cassette lock. The wafer is removed from the cassette, the transfer arm is returned to the center position and the arm is extended to station 28. In the example of FIG. 1, process station 28 is located on a disk 47 for mounting a plurality of wafers in a batch-type ion implanter. Wafers are mounted near the periphery of the disk, one at a time, by the wafer transfer apparatus. During wafer loading and unloading, the disk is incrementally rotated so that each wafer mounting site on the disk is presented to the wafer transfer apparatus.

Figure 2:
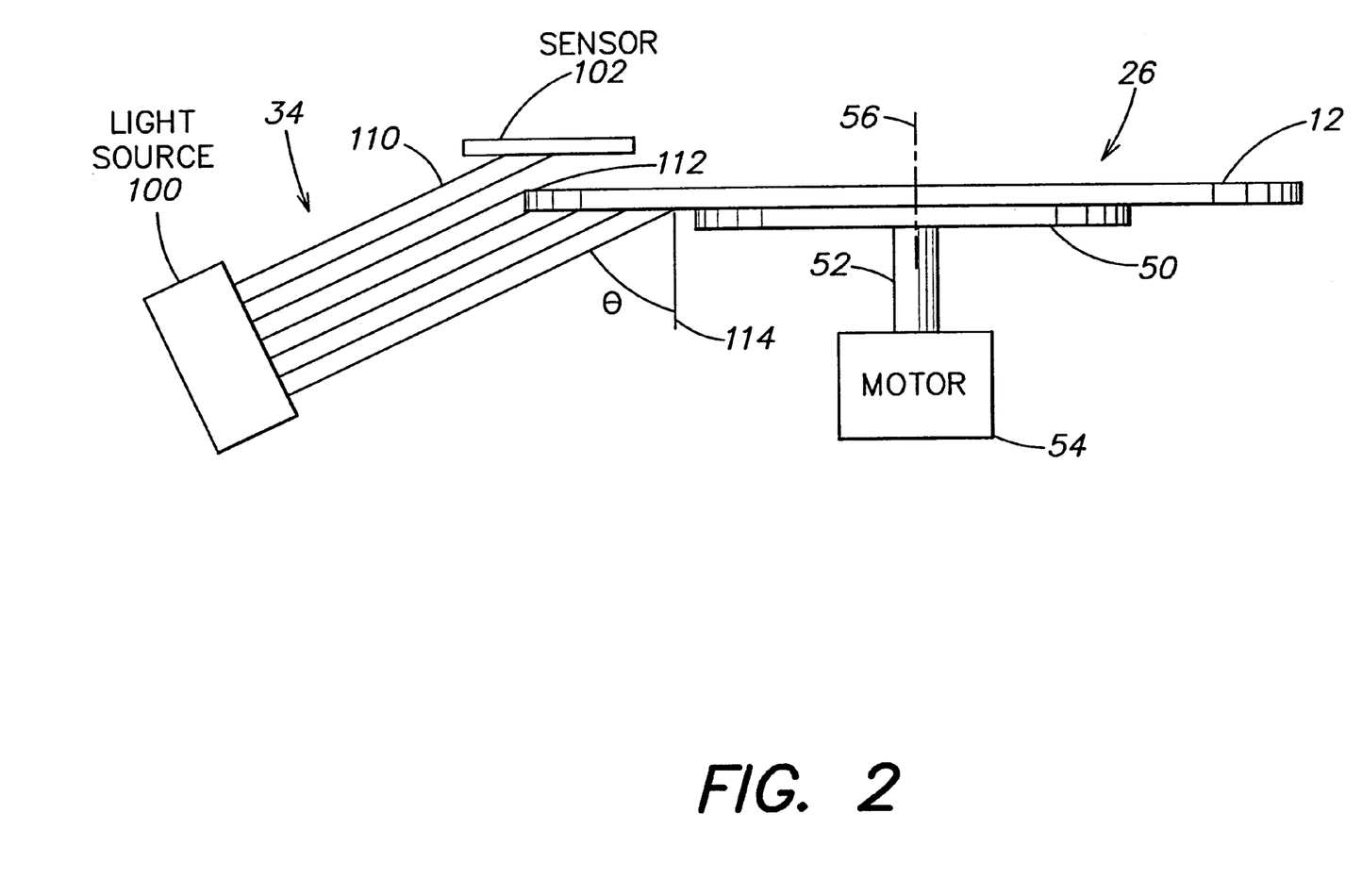
FIG. 2 is a schematic side view of the wafer orientation sensor.
Figure 3:
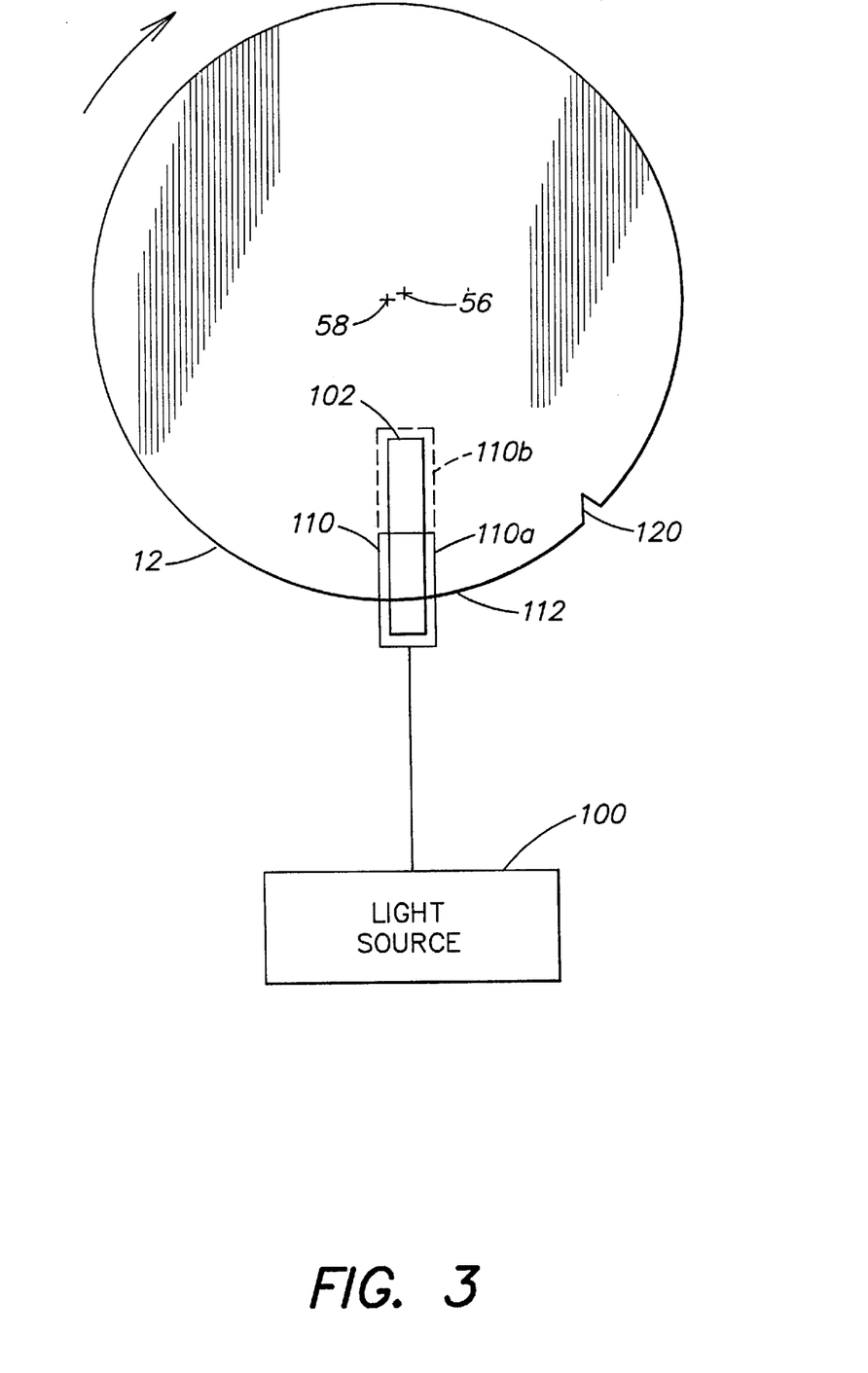
FIG. 3 is a schematic top view of the wafer orientation sensor of FIG. 2.

Schematic side and top views of orientation station 26 and orientation sensor 34 are shown in FIGS. 2 and 3, respectively. At orientation station 26, wafer 12 is positioned on a support pedestal 50 which is connected by a shaft 52 to a motor 54. When motor 54 is energized, pedestal 50 and wafer 12 are rotated about an axis 56. As shown in FIG. 3, axis of rotation 56 may be displaced from the center 58 of wafer 12 in cases where the wafer 12 is not perfectly centered on support pedestal 50. Pedestal 50 may extend upwardly through an opening 60 (FIG. 1) in wafer transfer arm 22 for orientation and may be retracted through opening 60 when orientation is complete.

Wafer orientation sensor 34 includes a light source 100 and a light sensor 102. Light source 100 produces a light beam 110 which may be collimated within 5 degrees. Light beam 110 is directed at an edge 112 of wafer 12 at an angle of θ with respect to a normal 114 to the surface of wafer 12. As described below, the angle θ is equal to or greater than a critical angle that produces total internal reflection of the light beam in wafer 12. Thus, any portion of the light beam 110 that is intercepted by wafer 12 is blocked, despite the fact that wafer 12 may be transparent in the wavelength range of light beam 110.

In the example of FIGS. 2 and 3, light source 100 is positioned radially outwardly and below wafer 12, and light beam 110 is directed at the lower surface of wafer 12 at angle θ. Furthermore, light source 100 is positioned such that a first part of the light beam passes the edge 112 of wafer 12 and a second part of the light beam is intercepted by wafer 12. Because the location of edge 112 changes due to a fiducial on the edge of the wafer and due to displacement of wafer center 58 relative to axis of rotation 56, light beam 110 should have sufficient width so that it is partially blocked by edge 112 over the range of expected positions of edge 112. If light beam 110 is totally blocked by wafer 12 at one extreme or is not incident on wafer 12 at the other extreme, the orientation sensor is unable to determine the location of the wafer edge.

Light sensor 102 is positioned above wafer 12 and in alignment with light beam 110. The first part of light beam 110 that passes wafer 12 is incident on sensor 102, whereas the second part of light beam 110 that is intercepted by wafer 12 is not incident on sensor 102. As shown in FIG. 3, sensor 102 may have a rectangular sensing area with the long dimension of the rectangular sensing area oriented radially with respect to axis of rotation 56. Light sensor 102 produces an edge signal that increases as the proportion of its sensing area receiving light beam 110 increases. As shown in FIG. 3, first part 110a of light beam 110 is incident on sensor 102, and second part 110b of light beam 110 is blocked by wafer 12. The position of edge 112 relative to light beam 110 and sensor 102 varies during rotation of wafer 12 about axis 56 as a result of wafer eccentricity and any fiducial, such as notch 120. This causes the proportion of light beam 112 that is blocked by wafer 12 to vary. That is, the relative proportions of first part 110a and second part 110b of light beam 110 vary, causing a variation in the edge signal, which is representative of wafer location and orientation. Referring again to FIG. 2, the light source 100 and sensor 102 may have different positions within the scope of the invention. For example, light source 100 may be located above and radially outwardly of wafer 12, and sensor 102 may be located below wafer 12. In each case, light beam 110 is directed at the surface of wafer 12 at an angle θ with respect to normal 114 that is equal to or greater than the critical angle. Further, the light beam 110 is positioned such that a first part of the beam passes the workpiece and is intercepted by the sensor and a second part of the light beam is intercepted by the wafer.

As indicated above, light beam 110 is directed at wafer 12 at angle θ relative to normal 114 to the surface of wafer 12 which is equal to or greater than the critical angle that produces total internal reflection of the light beam in the wafer. As known in the art, the critical angle is defined as $$I_c = \arc\sin(N_1/N_2) \qquad (1)$$

where $I_c$ is the critical angle with respect to the normal to the surface, $N_1$ is the index of refraction of the lower index material and $N_2$ is the index of refraction of the higher index material. The critical angle for an air-glass surface has a value of about 42 degrees, if the index of the glass is 1.5. In a preferred embodiment, the angle θ is equal to or greater than about 65 degrees so as to ensure total reflection in quartz, silicon, sapphire and glass wafers. It will be understood that different angles can be used depending on the materials of the wafers. The angle θ is selected to be equal to or greater than the critical angle as defined by Equation (1) above. This ensures that the part of light beam 110 which is incident on wafer 12 is blocked, even though wafer 12 may be transparent or partially transparent to the wavelength range of light beam 110.

The critical angle is the angle where the transmitted ray is tangent to the boundary between a higher index medium and a lower index medium, when the light is incident on the boundary from the higher index side. At the critical angle and greater, no transmitted light passes out of the higher index medium. This makes the wafer appear opaque to the sensor, because no light exits the opposite side of the wafer.

Semiconductor wafers and substrates are all optically more dense (higher index) than the air or vacuum in which the wafers are oriented. The index of refraction of wafers and substrates, including quartz and sapphire, is typically greater than 1.5. To ensure total internal reflection, light is transmitted into the wafer at approximately 65 degrees with respect to normal 114. This light passes through the wafer at approximately 48 degrees with respect to normal 114. Upon reaching the opposite side of the wafer, the light is parallel to the plane of the wafer or is reflected back into the wafer, so that no light is transmitted through the wafer.

Figure 4:
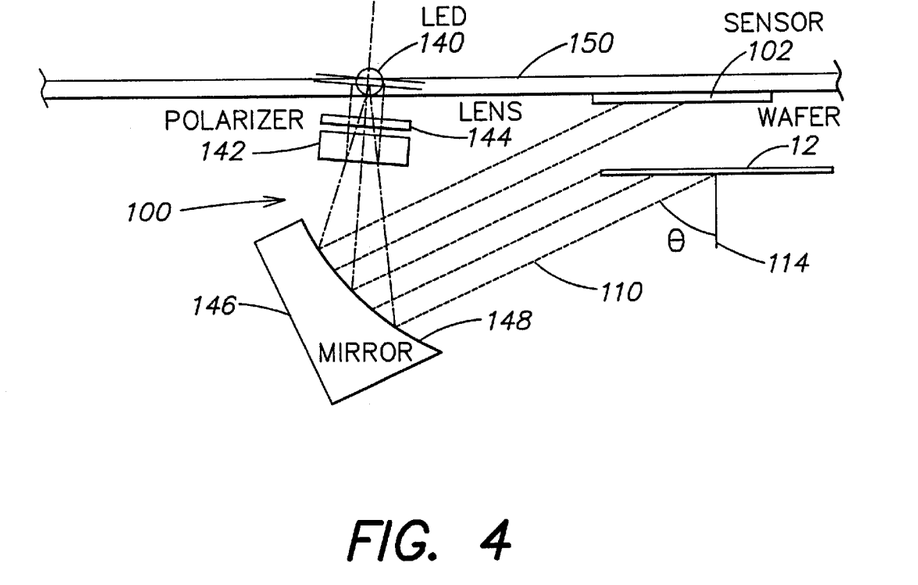
FIG. 4 is a schematic side view of an embodiment of the wafer orientation sensor of the present invention.
Figure 5:
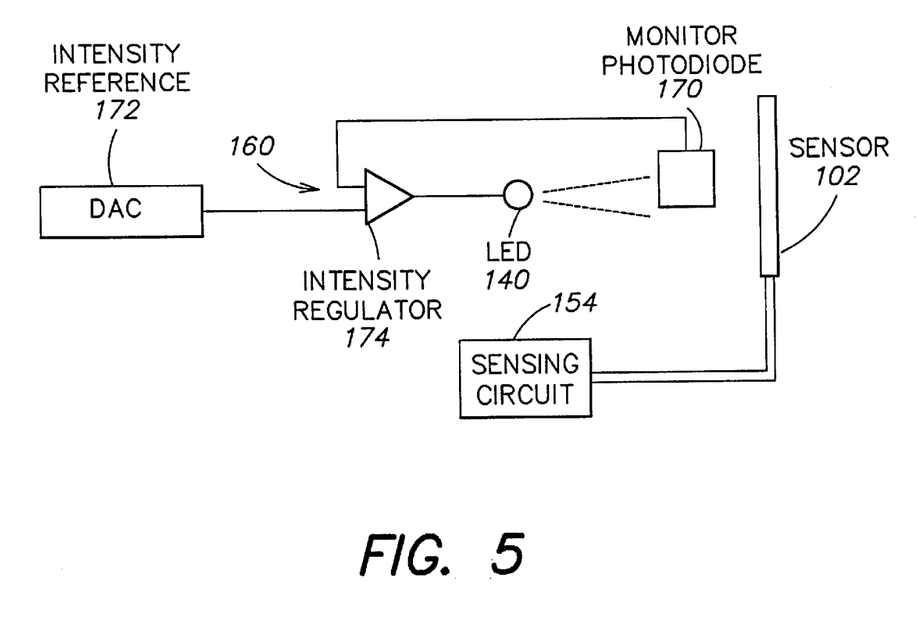
FIG. 5 is a schematic block diagram of the circuitry used in the wafer orientation sensor of FIG. 4.

An example of an implementation of wafer orientation sensor 34 is shown in FIGS. 4 and 5. Light source 100 includes a light emitting diode (LED) 140, a polarizer 142, a lens 144 and a mirror 146. Lens 144 may be a planoconvex cylindrical lens, and mirror 146 may be a 60 degree offset parabolic mirror with a gold or silver reflective surface 148. The LED 140 may be a single, high intensity light emitting diode having a wavelength of 880 nanometers and a 30° output light pattern, and may be driven from a controlled current source 160 (FIG. 5). The optics are anamorphic and reshape and collimate the light into a beam having a rectangular cross section. The collimated light beam is directed at wafer 12 at angle θ with respect to normal 114 of 65 degrees. The output of LED 140 is passed through polarizer 142 and then through the cylindrical lens 144. This establishes a fan-shaped beam of polarized light. The fan-shaped beam is then reflected by the parabolic mirror 146 and is collimated into a rectangular light beam. The optical elements collimate the light with high optical efficiency.

By way of example, the LED 140 may be in a TO-18 package with a metal base. The mount for the LED may be a machined block of aluminum which holds the LED in position and alignment, and serves as a heat sink. The mount (not shown) attaches to a printed circuit board 150. Attached to the LED mount assembly is a DELRIN lens mount which is used to hold the lens 144. The lens may be 5 millimeters by 10 millimeters with an 8 millimeter focal length. The focal point of lens 144 is aligned with LED 140. A strip of polarizing material 142 is placed on the flat of lens 144. The lines of polarization are perpendicular to the plane of the wafer. This reduces the effect of shallow angle reflection from the wafer surfaces. The mirror 146 is mounted below lens 144 and LED 140. The focal point of the mirror 146 is aligned with LED 140.

Light sensor 102 may be a dual photodiode with a 1 millimeter by 37 millimeter sensing area. The sensor is hermetically sealed and has a built-in infrared filter. The filter may be a controlled layer of silicon monoxide, which is optically clear at infrared. The filter allows infrared light from LED 140 to pass, but blocks visible light. Sensor 102 may be mounted to printed circuit board 150. The output of sensor 102 may be supplied to a sensing circuit 154 (FIG. 5), which may include amplification and processing circuitry as known in the art.

A monitor photodiode 170 may be located adjacent to sensor 102 outside the measuring area. Photodiode 170 also includes a built-in infrared filter. The output of photodiode 170 is used to sense the intensity of light from the light source and to adjust the current supplied to LED 140, so that LED 140 provides a constant light output. As shown in FIG. 5, monitor photodiode 170 and an intensity reference digital-to-analog converter 172 are coupled to inputs of an intensity regulator circuit 174. Intensity regulator circuit 174 supplies a controlled current to LED 140.

Figure 6:
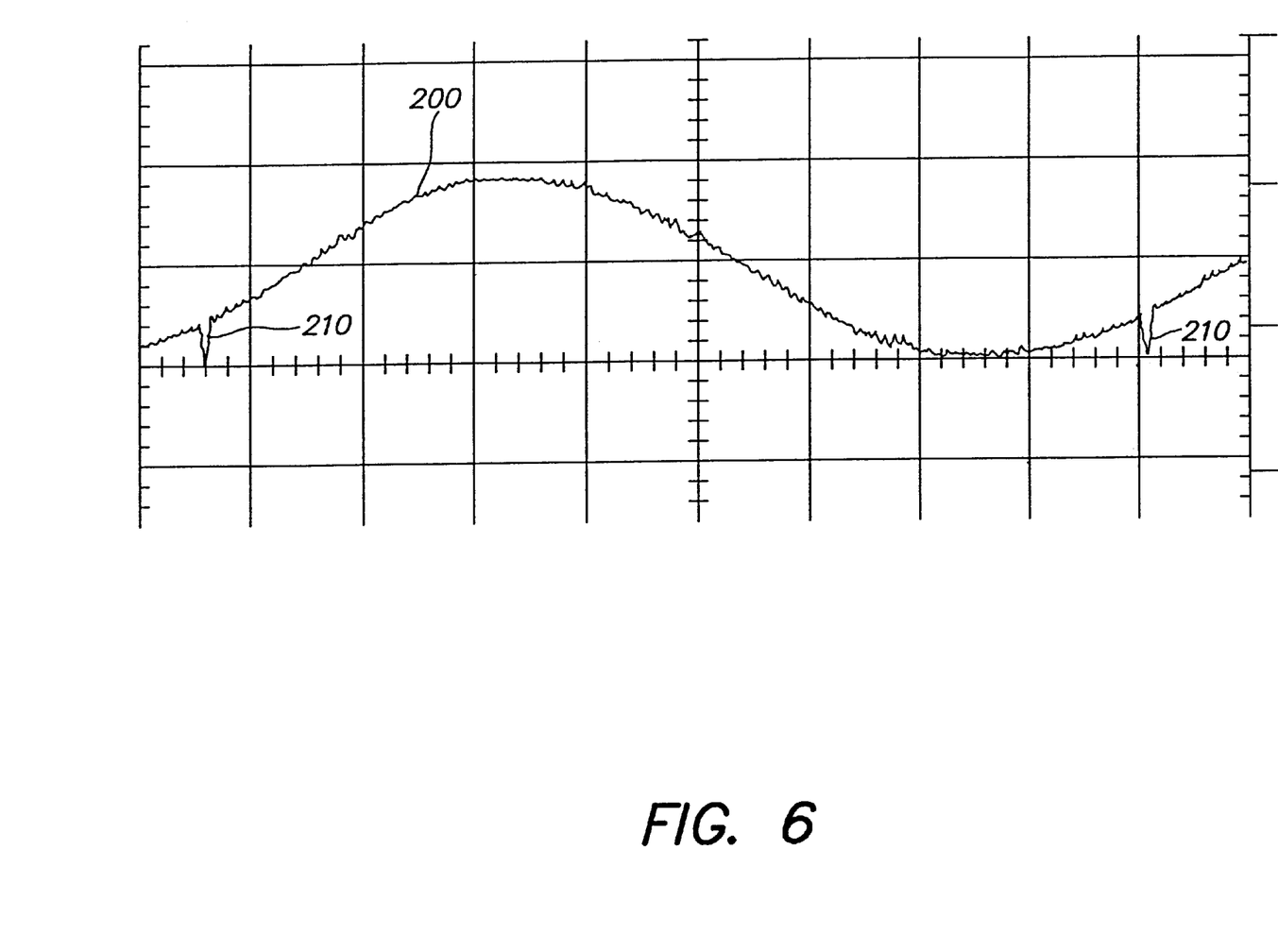
FIG. 6 is a graph of edge signal as a function of time for a notched wafer having a polished edge.

A graph of edge signal from the wafer orientation sensor as a function of time is shown in FIG. 6. The edge signal varies with time as the wafer is rotated about axis 56 (FIG. 2). A waveform 200 represents the edge signal from a notched quartz wafer with a polished edge. The roughly sinusoidal shape of waveform 200 is indicative of the eccentricity of the wafer with respect to the axis of rotation 56. By analyzing the amplitude of waveform 200 as a function of angle with respect to axis of rotation 56, the X and Y components of offset with respect to axis of rotation 56 can be determined. Fiducial notch 120 (FIG. 3) is clearly visible in waveform 200 as a spike 210, thereby indicating the angular orientation of wafer 12. Waveform 200 can be correlated to rotation of wafer 12 about axis of rotation 56 by using a shaft encoder mounted to the output shaft of motor 54.

Figure 7:
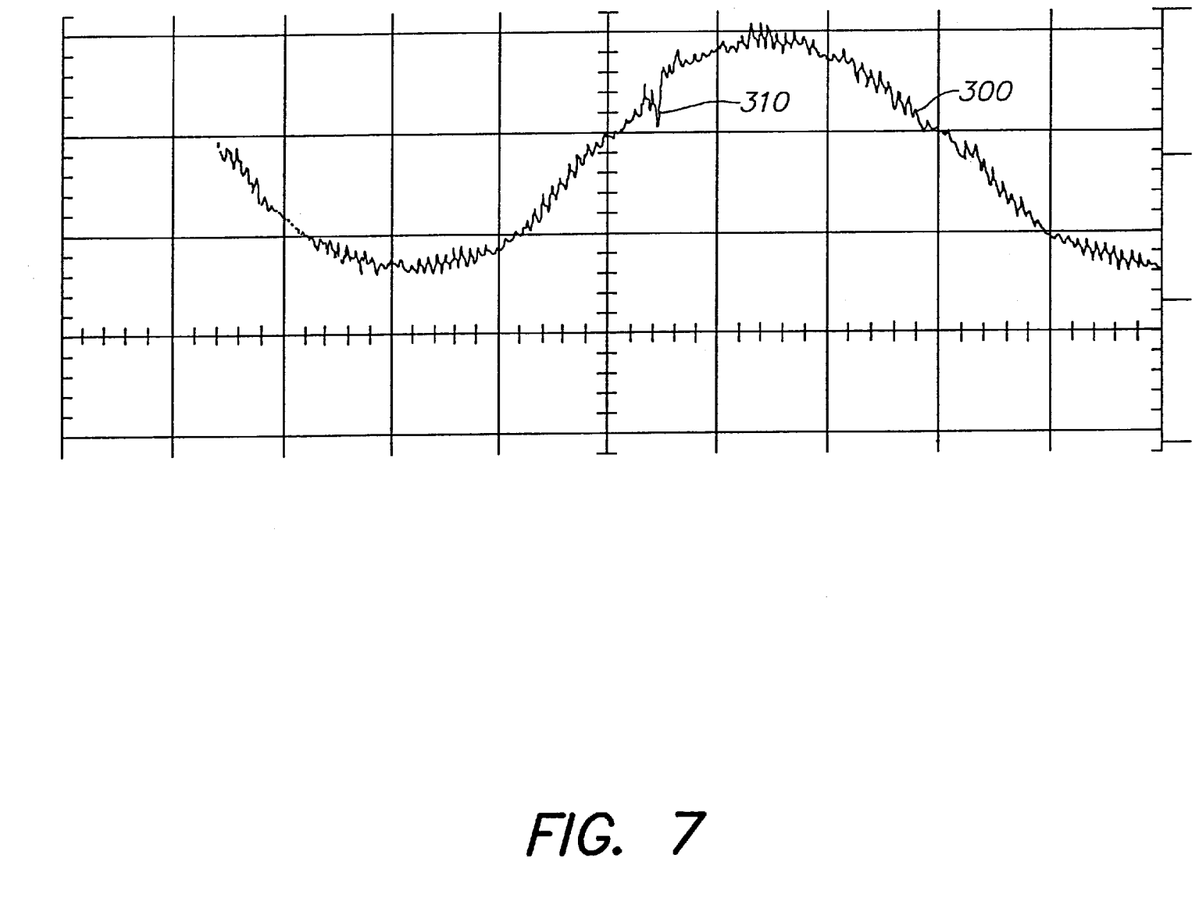
FIG. 7 is a graph of edge signal as a function of time for a notched glass wafer having an unpolished edge.

A graph of wafer orientation sensor edge signal as a function of time is shown in FIG. 7. Waveform 300 represents the edge signal for a notched glass wafer having an unpolished edge. The noise superimposed on the generally sinusoidal waveform 300 represents the rough edge of the wafer, and the notch is represented by a spike 310.

As discussed above, the angular orientation and the eccentricity of the wafer are determined from the edge signal generated by the wafer orientation sensor. The determined values are then used to correct the angular orientation and position of the wafer. In particular, the angular orientation may be corrected by rotating wafer 12 about axis of rotation 56 on support pedestal 50. Position errors may be eliminated by compensating displacements as the wafer is transferred from orientation station 26 to process station 28 (FIG. 1).

The wafer orientation sensor of the present invention locates fiducials and position errors in semiconductor wafers of various materials, including but not limited to quartz, silicon, sapphire and glass. The orientation sensor locates either notch or flat fiducials on semiconductor wafers. The edge signal as the wafer is rotated represents the angular orientation and location of the wafer. The edge signal appears the same for all wafer types. Thus, different types of wafers, such as quartz test wafers and production silicon wafers, can be mixed in the same process cycle.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for detection of an edge of a generally disk-shaped workpiece having a surface, comprising:
    a light source positioned to direct a light beam at the surface of the workpiece near the edge thereof such that a first part of the light beam passes the workpiece and a second part of the light beam is intercepted by the workpiece, wherein an angle between the light beam and a normal to the surface is equal to or greater than a critical angle that produces total internal reflection of the light beam in the workpiece;

a mechanism for rotating the workpiece; and a light sensor positioned to sense the first part of the light beam and to generate an edge signal that represents the edge of the workpiece as the workpiece is rotated.

2. Apparatus as defined in claim 1 wherein said angle is equal to or greater than 65 degrees.

3. Apparatus as defined in claim 1 wherein the workpiece comprises a semiconductor wafer and wherein said light source, said rotating mechanism and said light sensor are configured for sensing a fiducial on the semiconductor wafer.

4. Apparatus as defined in claim 3 wherein the semiconductor wafer is at least partially light transmissive and wherein said light source and said light sensor are configured for sensing the fiducial on the semiconductor wafer.

5. Apparatus as defined in claim 3 wherein the semiconductor wafer is a material selected from the group consisting of quartz, silicon, sapphire and glass, and wherein said light source and said light sensor are configured for sensing the fiducial on the semiconductor wafer.

6. Apparatus as defined in claim 3 wherein the fiducial comprises a notch in the edge of the semiconductor wafer and wherein said light source and said light sensor are configured for sensing the notch.

7. Apparatus as defined in claim 3 wherein the fiducial comprises a flat on the edge of the semiconductor wafer and wherein said light source and said light sensor are configured for sensing the flat.

8. Apparatus as defined in claim 1 wherein said light sensor comprises a linear sensor having a long dimension, wherein the long dimension of said linear sensor is oriented radially with respect to the center of rotation of the workpiece.

9. Apparatus as defined in claim 1 wherein said light source includes optics for directing a collimated light beam at the surface of the workpiece.

10. Apparatus as defined in claim 1 wherein said light source comprises a light emitting diode, a polarizer, a lens and a parabolic mirror for collimating the light output of the light emitting diode.

11. Apparatus as defined in claim 1 wherein said light source includes optics for generating a rectangular light beam having a long dimension and wherein the rectangular light beam is directed at the surface of the workpiece with the long dimension of the rectangular light beam oriented radially with respect to the center of rotation of the workpiece.

12. Apparatus as defined in claim 1 further comprising a second light sensor for monitoring the intensity of the light beam and for generating a feedback signal representative of the intensity, wherein said light source includes an intensity adjustment circuit for controlling the intensity of the light beam in response to the feedback signal.

13. Apparatus as defined in claim 1 wherein the angle between the light beam and the normal to the surface of the workpiece is selected to produce total internal reflection in a workpiece having an index of refraction of 1.5 or greater.

14. A method for detecting an edge of a generally disk-shaped workpiece having a surface, comprising the steps of:

directing a light beam at the surface of the workpiece near the edge thereof such that a first part of the light beam passes the workpiece and a second part of the light beam is intercepted by the workpiece, wherein an angle between the light beam and a normal to the surface is equal to or greater than a critical angle that produces total internal reflection of the light beam in the workpiece;

rotating the workpiece; and sensing the first part of the light beam and generating an edge signal that represents the edge of the workpiece as the workpiece is rotated.

15. A method as defined in claim 14 wherein the light beam is directed at the surface of the workpiece at an angle equal to or greater than 65 degrees.

16. A method as defined in claim 14 wherein the step of sensing the first part of the light beam comprises sensing a fiducial on a semiconductor wafer.

17. A method as defined in claim 14 wherein the step of sensing the first part of the light beam comprises sensing the light beam with a linear sensor having a long dimension oriented radially with respect to the center of rotation of the workpiece.

18. A method as defined in claim 14 wherein the step of directing a light beam comprises directing a collimated light beam at the surface of the workpiece.

19. A method as defined in claim 14 wherein the step of directing a light beam includes generating a rectangular light beam and directing the rectangular light beam at the surface of the workpiece with a long dimension of the rectangular light beam oriented radially with respect to the center of rotation of the workpiece.

20. A method as defined in claim 14 further comprising the steps of monitoring the intensity of the light beam, generating a feedback signal representative of the intensity and controlling the intensity of the light beam in response to the feedback signal.

* * * * *